(12) United States Patent
Lvovsky et al.

(10) Patent No.: US 9,874,618 B2
(45) Date of Patent: Jan. 23, 2018

(54) CONTROL SYSTEM AND METHOD FOR A SUPERCONDUCTING MAGNET

(71) Applicant: GENERAL ELECTRIC COMPANY, Schenectady, NY (US)

(72) Inventors: Yuri Lvovsky, Florence, SC (US); Longzhi Jiang, Florence, SC (US); Mark Derakhshan, Florence, SC (US); Edwin Legall, Florence, SC (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 499 days.

(21) Appl. No.: 14/582,508

(22) Filed: Dec. 24, 2014

(65) Prior Publication Data

US 2016/0187439 A1 Jun. 30, 2016

(51) Int. Cl.
- *G01R 33/3815* (2006.01)
- *G01R 33/28* (2006.01)
- *G01R 33/3875* (2006.01)
- *G01R 33/54* (2006.01)

(52) U.S. Cl.
CPC ....... *G01R 33/3815* (2013.01); *G01R 33/288* (2013.01); *G01R 33/3875* (2013.01); *G01R 33/543* (2013.01)

(58) Field of Classification Search
CPC .............. G01R 33/3815; G01R 33/288; G01R 33/3875; G01R 33/543
See application file for complete search history.

(56) References Cited

U.S. PATENT DOCUMENTS

| | | | |
|---|---|---|---|
| 5,862,028 A | 1/1999 | Kalsi | |
| 8,542,015 B2 * | 9/2013 | Lvovsky | G01R 33/3815 324/318 |
| 2002/0030952 A1 | 3/2002 | Buckles et al. | |
| 2004/0239462 A1 | 12/2004 | Nemoto et al. | |
| 2010/0284120 A1 * | 11/2010 | Beier | G01R 33/288 361/141 |
| 2011/0069418 A1 * | 3/2011 | Huang | G01R 33/288 361/19 |
| 2012/0182012 A1 | 7/2012 | Lvovsky et al. | |
| 2014/0028316 A1 | 1/2014 | Mine et al. | |
| 2014/0167757 A1 | 6/2014 | Laskaris et al. | |
| 2015/0255977 A1 * | 9/2015 | Jonas | G01R 33/3815 361/19 |

OTHER PUBLICATIONS

Search Report and Written Opinion for International Application No. PCT/US2015/066019, dated Mar. 3, 2016. 3 pages.

* cited by examiner

*Primary Examiner* — Rodney Bonnette

(74) *Attorney, Agent, or Firm* — Grogan, Tuccillo & Vanderleeden, LLP

(57) ABSTRACT

A control system for a superconducting magnet includes an electrically conductive lead having a first end electrically coupled to the superconducting magnet, at least one of a main power supply, a shimming power supply and a discharge module electrically coupled to a second end of the lead, and a controller in communication with the at least one of the main power supply, the shimming power supply and the discharge module. The controller is configured to monitor at least one magnet parameter value indicative of a state of the superconducting magnet and to automatically control operation of the at least one of the main power supply, the shimming power supply and the discharge module when the magnet parameter value crosses a predetermined threshold value prior to a quench.

24 Claims, 6 Drawing Sheets

CONTROL SYSTEM AND METHOD FOR A SUPERCONDUCTING MAGNET

BACKGROUND

Technical Field

Embodiments of the invention relate generally to magnetic resonance imaging and, more specifically, to an automated control system and method for a superconducting magnet of a magnetic resonance imaging device.

Discussion of Art

Currently, superconducting magnets used in magnetic resonance imagine (MRI) devices installed in clinical sites are typically cooled by a bath of liquid cryogen, such as liquid helium. These magnets require periodic maintenance, which includes ramping up or ramping down (e.g. adjusting current to compensate for annual drift), re-shimming to restore homogeneity, periodic changes of the cryocooler (coldhead), etc. This maintenance is typically performed by a field engineer that must come to the clinical site.

Closed, conductive/convection cooled magnets may require even additional periodic maintenance, which can contribute to increased operating costs and downtime. In particular, such magnets have limited ride-through capability due to the absence of a large helium bath. When the ride-through time limit is exceeded, such as, for example, due to an extended power outage, coldhead failure, or prolonged coldhead changeout, the magnet coils may warm and ultimately quench. After such quench, a field engineer would typically have to come to the clinical site to re-ramp the magnet and re-shim the magnet into optimum operating ranges.

In connection with the above, even though design efforts have been aimed at extending ride-through time, there may always remain certain non-covered clinical scenarios where the maximum duration has been exceed, and the magnet will begin to warm and eventually quench. In these scenarios, the only way to guarantee that the magnet doesn't quench during any outage is to de-energize the magnet before quench occurs, which involves ramping down of the magnet where current is slowly withdrawn from the magnet, and magnetic field strength reduced. Presently, however, ramping up and ramping down is a tedious process, which requires a field engineer to be on site to manually engage the leads and thus close the discharging circuit.

It is therefore desirable to be able to automatically monitor the operational status of the magnet, as well as to remotely control and perform the discharge and ramping up or down of the magnet. In particular, it is desirable to be able to automatically ramp down when an increase in magnet temperature, or other critical parameter is detected above a threshold level, and to automatically re-ramp when any issues are resolved.

BRIEF DESCRIPTION

In an embodiment, a control system for a superconducting magnet is provided. The control system includes an electrically conductive lead having a first end electrically coupled to the superconducting magnet, at least one of a main power supply, a shimming power supply and a discharge module electrically coupled to a second end of the lead, and a controller in communication with the at least one of the main power supply, the shimming power supply and the discharge module. The controller is configured to monitor at least one magnet parameter value indicative of a state of the superconducting magnet and to automatically control operation of the at least one of the main power supply, the shimming power supply and the discharge module when the magnet parameter value crosses a predetermined threshold value prior to a quench.

In an embodiment, a method for controlling operation of a superconducting magnet is provided. The method includes the steps of sensing at least one magnet parameter value indicative of a state of a superconducting magnet, comparing the at least one parameter value to a threshold value stored in memory, and automatically initiating at least one of a ramp-down of the magnet, a ramp-up of the magnet and a shimming operation if the at least one magnet parameter value crosses the threshold value.

In an embodiment, a method for automatically controlling a ramp-down of a superconducting magnet comprising is provided. The method includes the steps of electrically coupling a discharge module to the superconducting magnet, the discharge module including at least one a resistor and diode stack, monitoring at least one magnet parameter value indicative of a current state of the superconducting magnet, and, at a control unit, automatically initiating a controlled ramp-down of the magnet when the at least one magnet parameter value crosses a threshold value stored in memory.

In an embodiment, a current lead assembly for a superconducting magnet is provided. The current lead assembly includes a vacuum chamber, a superconducting magnet arranged inside of the vacuum chamber and having a magnet lead and a current contact coupled to the magnet lead, a retractable current lead having a retractable contact, and an actuator assembly coupled to the retractable current lead. The actuator assembly is configured to automatically move the retractable contact of the retractable current lead between a first position in which the retractable contact is spaced from the current contact, and a second position in which the retractable contact is in contact with the current contact.

DRAWINGS

The present invention will be better understood from reading the following description of non-limiting embodiments, with reference to the attached drawings, wherein below:

DETAILED DESCRIPTION

Figure 1:
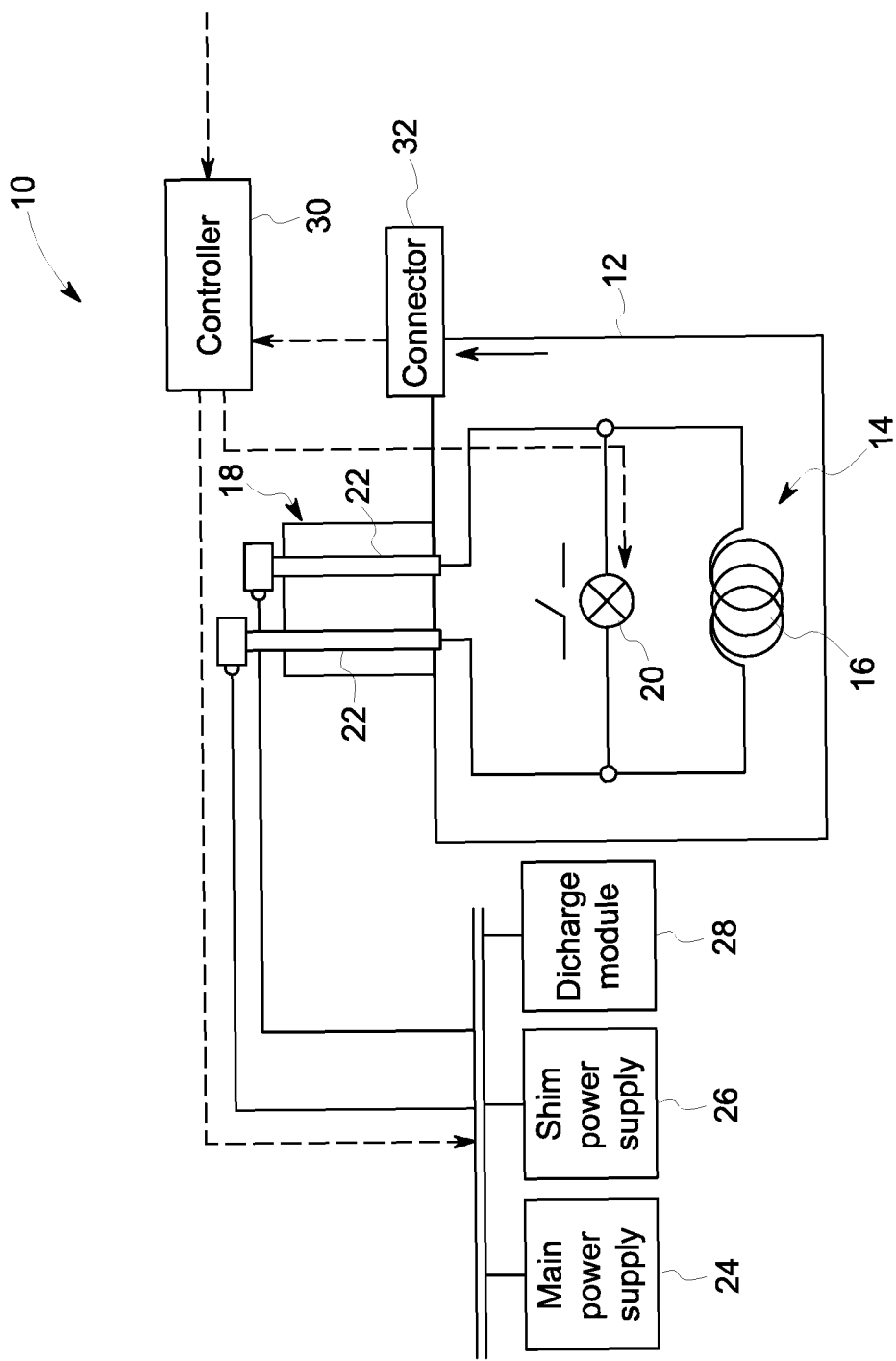
FIG. 1 is a schematic block diagram of a control system for a superconducting magnet in accordance with an embodiment of the present invention.

Reference will be made below in detail to exemplary embodiments of the invention, examples of which are illustrated in the accompanying drawings. Wherever possible, the same reference characters used throughout the drawings refer to the same or like parts. Although embodiments of the present invention are described as intended for use with superconducting magnets embodied in MRI machines, the present invention may also be used for the cooling of superconducting magnets, generally, irrespective of their specific end use. The superconducting magnets may also be implemented in other types of medical imaging devices, as well as non-medical imaging devices. As used herein, "electrical contact," "electrical communication," and "electrically coupled" means that the referenced elements are directly or indirectly connected such that an electrical current may flow from one to the other. The connection may include a direct conductive connection (i.e., without an intervening capacitive, inductive or active element), an inductive connection, a capacitive connection, and/or any other suitable electrical connection. Intervening components may be present. As used herein, "selectively coupled" means that a component may be coupled to another component in one mode of operation, and decoupled with the other component in another mode of operation. As used herein, "communication" or "communication link" may refer to any connection, wire, port, device, and/or signal and/or any transmission, exchange, repeating, and/or other flow of information or data that is processed by an entity, and/or that is shared or exchanged between two or more people, devices, and/or other entities.

Referring now to FIG. 1, a control system 10 for a superconducting magnet is illustrated. As shown therein, the system 10 includes a vacuum chamber 12 housing a superconducting magnet 14 having a plurality of magnet coils 16, a thermal shield (not shown) cooled by a cryocooler (not shown) in a manner heretofore known in the art, and a current lead assembly 18. In an embodiment, the cryocooler may be a part of a low-cryogen cooling system whereby liquid helium is circulated within a cooling loop to cool the magnet coils 16 and the thermal shield. In an embodiment, the cryocooler may be connective to pure conductive cooling pathways, thus constituting a "dry" magnet without any cryogen present. In yet another implementation, the coils may be located inside helium vessel and cooled by liquid helium bath, while the cryocooler performs recondensing of evaporated helium vapor back into liquid. The superconducting magnet 14 is usually cooled to a temperature of about 4 Kelvin (K), while the thermal shield is usually cooled to a temperature of about 50K. However, embodiments are not limited to these exemplary temperatures and other temperatures are contemplated. A persistent switch 20 is connected across the coil winding ends.

In an embodiment, the current lead assembly 18 includes permanent leads 22 that extend into the vacuum chamber 12 via a through-hole (not shown) in the vacuum chamber 12. These current leads 22 each include one end electrically coupled to the superconducting coil 16, and another end electrically coupled to a main power supply 24, a shim and heaters power supply 26 or a discharge module 28. The superconducting magnet 14 may be coupled to the power supply 24 during a ramp operation to power or charge the magnet 14 to a specified field, then put it into a persistent mode, as discussed hereinafter. In an embodiment, the power supply 24 is a high current, low voltage DC power supply (from approximately 4-5V to approximately 20V) that provides current to the coil windings 16. In an embodiment, the discharge module 28 may be utilized to ramp down the magnet 14 under control of the controller 30 and the shim power supply 26 may be utilized to shim the magnet 14 (i.e. to optimize the homogeneity of the magnetic field) under control of the controller 30.

In connection with the above, the main power supply 24, shim and heaters power supply 26 and the discharge module 28 are in communication with a controller 30 that is configured to control the power supply 24, power supply 26 and quench module 28 according to a preprogrammed set of instructions. For example, the controller 30 is configured to accomplish current changes through the magnet 14 gradually, in gentle ramps, to energize or de-energize the magnet 14. The controller is also configured, once the magnet 14 is energized, to turn off the power supply 24 and to close the switch 20 to transition the magnet 14 to persistent mode.

As further illustrated in FIG. 1, the controller 30 is also in communication with a plurality of sensors (not shown) that are configured to monitor various internal magnet parameters such as magnet temperature, current, pressure etc. and to relay signals representing the monitored parameters to the controller 30 through a connector 32. Accordingly, the sensors may be attached to or adjacent to the magnet coils 16, coil formers, the thermal shield, the switch 20 and/or the coldhead, etc. Similarly, the controller 30 is also configured to receive external signals representing measured or monitored external parameters such as programming instructions, commands or the like, power status (e.g. whether or not power is available or there is a power outage), etc.

In an embodiment, the controller 30 may be configured to initiate and control ramp up, ramp down, shim current adjustments, external dump/discharge to either the quench/dump/discharge module 28 or the main power supply 24, and/or quench in dependence upon the internal and external parameters received by the controller 30, and in accordance with a pre-programmed set of instructions stored in memory. For example, when monitored magnet conditions approach quench or cross predetermined quench or action thresholds stored in memory, such as, for example, due to a power interruption or coldhead changeout, the controller may open the switch 20 (to take the magnet 14 out of persistent mode) and the magnet 14 may be automatically and remotely discharged under control of the controller 30, with or without real time input from a technician or field engineer. In particular, the switch 20 may be opened and the magnet 14 may be denergized and ramped-down under control of the controller 30 using the discharge module 28, where current is slowly lowered in the magnet 14 to reduce the magnetic field strength. In an embodiment, where the cooling system includes a conventional, helium bath-cooled magnet, the parameter may be a level of remaining liquid helium.

Similarly, after operating conditions are restored to within allowable working ranges (e.g., power is restored, cooling capacity is restored, etc.), the magnet 14 may be automatically (and remotely) re-ramped under control of the controller 30 using the main power supply 24, and/or re-shimmed under control of the controller 30 using the shimming power supply 26 so normal operations can resume. In an embodiment, the controller 30 may be controlled or configured remotely from a location outside the clinical site at which the magnet 14 may be located. In an embodiment, commands can also be initiated by the controller 30 based on pre-set time conditions stored in memory.

In an embodiment, the control system and method, as shown in FIG. 1, is applicable to both helium bath-cooled and conduction (or conduction/convection) cooled magnets. As will be readily appreciated, the control system of the present invention may be utilized to prevent quench in low/no helium MRI magnets and enables the use of superconducting magnets, such as in magnetic resonance imaging devices, in regions and clinical settings that may have a power grid with sub-standard power quality (such as a region that experiences frequent power outages). In addition, the system of the present invention facilitates reliable cold-head changeout, as the magnet may be easily and reliably discharged and ramped down to prevent quench during changeout, without requiring a field engineer be on site. In connection with the above, the system may reduce the total cost of ownership and the cost of service contracts due to maintenance procedures now being remotely executable. Moreover, longer services response times may be accommodated and the criticality of service response may be removed, as remote and/or automatic procedures to prevent quench may be undertaken by the system instead. Furthermore, it is also contemplated that the controller may collect information and statistics on the status of the magnet, such as its use and response to conditions of its cooling system (e.g., coldhead, compressor) and power grid for follow-on research and use.

Figure 2:
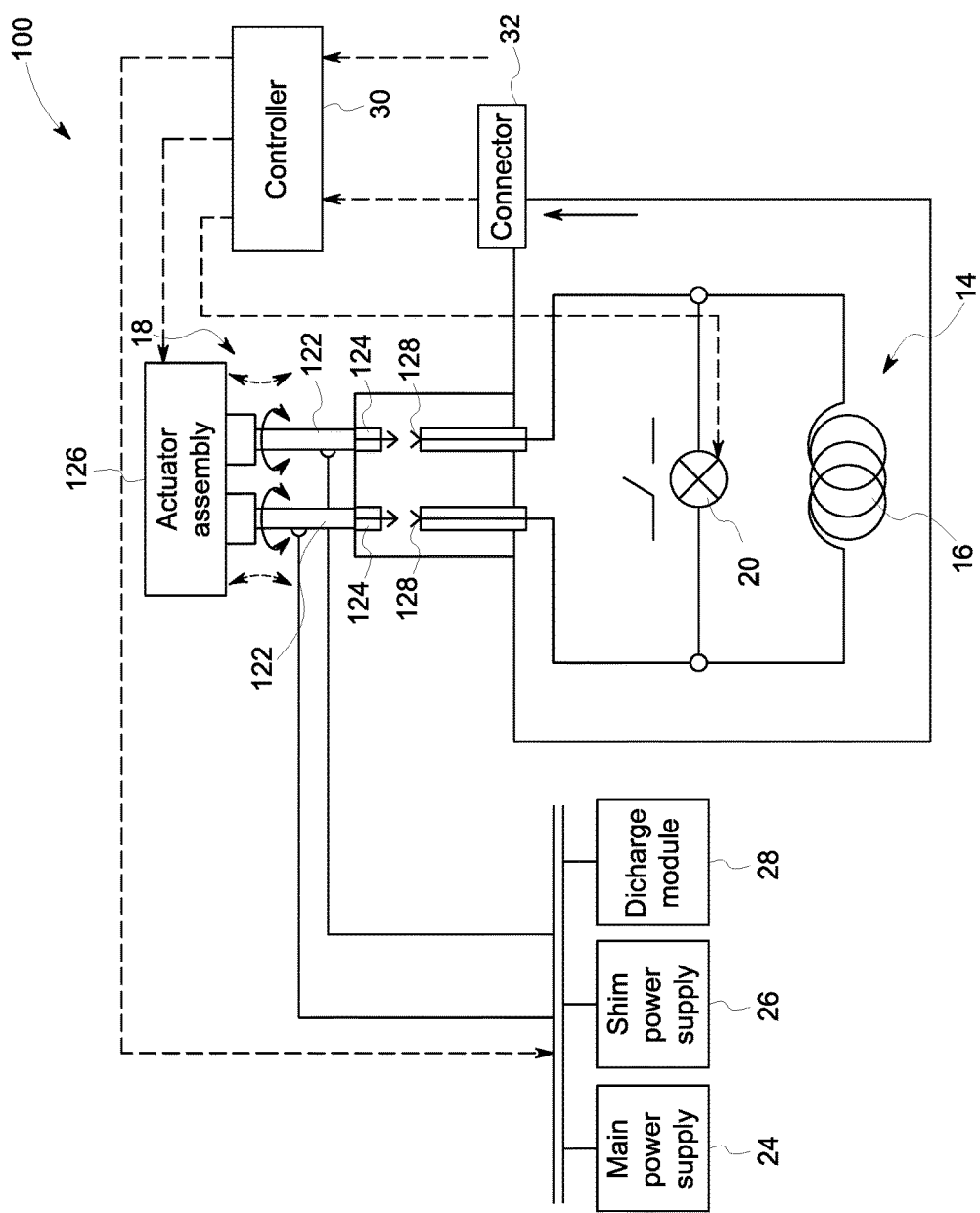
FIG. 2 is a schematic block diagram of a control system for a superconducting magnet in accordance with another embodiment of the present invention.

With reference to FIG. 2, a control system 100 for a superconducting magnet according to another embodiment of the present invention is illustrated. The cooling system 100 is substantially identical to the cooling system 10 of FIG. 1, where like reference numerals designate like parts. As illustrated in FIG. 2, however, the current lead assembly includes re-closable or retractable leads 122 having a retractable contact 124, rather than permanent leads. An actuator assembly 126 is provided to retractably engage and disengage the retractable contact 124. The retractable current lead 122 and retractable contact 124 can be formed as one part (as shown) or separated into multiple parts such as an actuation rod and a contact portion. The actuator assembly 126 can be arranged according to various techniques to enable the retractable current lead 122 to retractably extend into the vacuum chamber 12 to contact current contacts 128 that are electrically connected to the magnet leads of the magnet windings. The actuator assembly 126 may be formed as an electric drive motor or hydraulic drive, although other types of actuators may also be utilized without departing from the broader aspects of the present invention.

In connection with the above, the controller 30 is operable to control the actuator assembly 126 to open or close the connection between the retractable current lead 122 and the current contacts 128. In an embodiment, the current contacts 128 may be maintained either at low temperature, about 50K, when the current lead 122 is retracted, or at ambient temperature when the current contact 124 of the retractable lead 122 is engaged with contacts 128. As will be readily appreciated, the reclosable leads 122 allow heat leak from the leads 122 to the magnet 14 during operation to be stopped or minimized by removing the conductive connection between the leads 122 and the magnet coils 16. In an embodiment, the controller 32 is configured to control the actuator assembly 126 to bring the retractable contact 124 into contact with the current contacts 128 prior to ramping up or down and prior to dumping to the discharge module 28, as discussed above in connection with FIG. 1.

Figure 3:
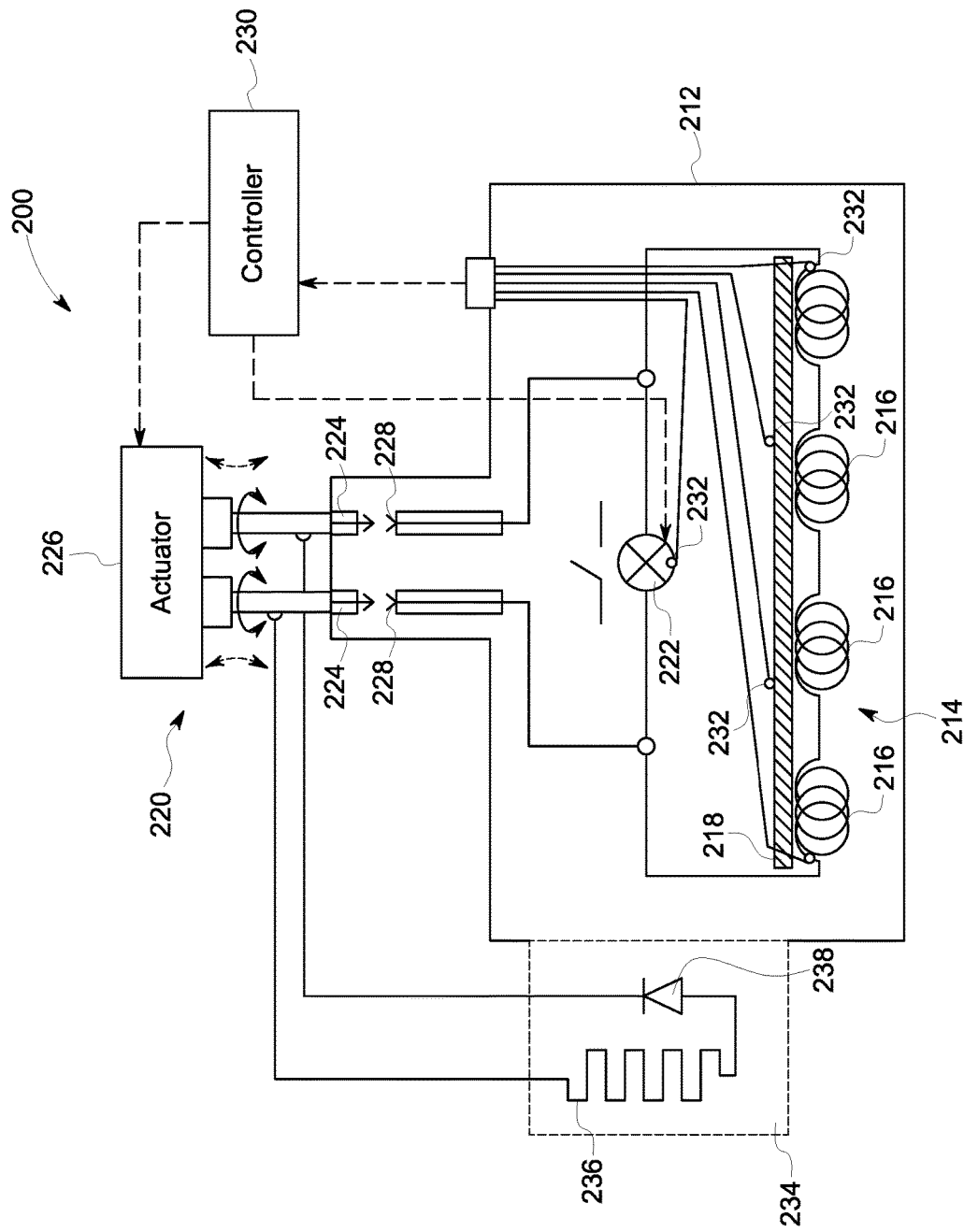
FIG. 3 is a schematic block diagram of a control system for a superconducting magnet in accordance with yet another embodiment of the present invention.

Turning now to FIG. 3, a control system 200 for a superconducting magnet according to another embodiment of the present invention is illustrated. As with the systems 10, 100 of FIGS. 1 and 2, the system 200 shown in FIG. 3 includes a vacuum chamber 212 housing a superconducting magnet 214 having a plurality of magnet coils 216 supported by a coil former or support shell 218, a thermal shield (not shown) cooled by a cryocooler (not shown) and a current lead assembly 220. A main switch or persistent switch 222 is connected across the winding ends of the magnet coils 216. In an embodiment, the lead assembly 220 includes retractable leads 224 and an actuator 226 that is configured to selectively move the leads 224 into and out of contact with current leads 228 of the magnet 214 in the manner heretofore described, under control of a controller 230. In an embodiment, the lead assembly 220 may be a permanent lead assembly.

In an embodiment, the system 200 also includes a plurality of sensors 232 for monitoring and sensing a plurality of magnet parameters such as temperature, current, pressure etc. For example, the sensors 232 may be adjacent to, or in contact with, the magnet coils 216, the thermal shield, the coil support shell 218, the main switch 222, the coldhead or other components internal to the vacuum vessel 212. The sensors 232 are configured to relay signals indicative of the sensed magnet parameters to the controller 230 for processing and analysis.

With further reference to FIG. 3, the system 200 also includes an autonomous external dump or discharge module 234 electrically connected to the leads 224 of the lead assembly 220. The discharge module 234 includes at least one discharge resistor 236 and/or at least one diode stack 238 that allows for a controlled ramp-down of current from the magnet 214. In an embodiment, the discharge module 234 may be located adjacent to a machine in which the magnet 214 is embodied (such as a magnetic resonance imaging device). In an embodiment, the discharge module 234 may be located remotely from the device, such as in an equipment room or the like.

In operation, the controller 30 is configured to store pre-set threshold limits for magnet parameters in memory. When signals from the sensors 232 (which may be pressure sensors or temperature sensors) located on the coils 216, formers 218, or coldhead exceed one or more of the pre-set values stored in memory, the controller 230 may initiate magnet discharge or dump to prevent potential quench. As will be readily appreciated, various events may cause the magnet parameters to cross threshold values such as, for example, a power outage, coldhead changeout or service, etc. As used herein, "cross" or "crosses" is intended to include scenarios where a parameter value exceeds a threshold value and/or when a parameter value drops below a threshold value.

Further to the above, the controller 230 is programmed to receive at least one magnet parameter value indicative of a present state of the superconducting magnet 214 and, if the parameter value crosses a threshold stored in memory, to discharge the magnet 214 through the discharge module 234. Accordingly, upon detection of an over-limit magnet parameter value, the controller 230 commands the actuator assembly 220 to close the leads 224. The controller 230 then controls the main switch 222 to its open position to initiate discharge. In operation of the discharge module 234, the resistor 236 and diode stack 238 act as a resistance or load that draws current from the magnet 214, which can be selectively engaged to increase the resistance/load in a controlled manner. As will be readily appreciated, once the magnet 214 is safely discharged the magnet 214 may be re-ramped automatically and remotely if the system includes an on-site ramp power supply such as that illustrated in FIGS. 1 and 2. In other embodiments, a field engineer may initiate re-ramp on site.

The system 200 of the present invention therefore allows for the avoidance of magnet quench even with prolonged outages beyond the ride-through capability limit by providing for the automatic and remote discharge of the magnet when critical magnet parameter limits are crossed. This, in turn, shortens the recovery time and re-ramp of the magnet after an outage because energy stored in the magnet which would normally warm the magnet (and necessitate a longer recovery time) can be discharged or dumped outside the magnet. Moreover, because the magnet may be easily discharged upon power outages and the like to eliminate long recovery times, siting of the magnets in locations where power outages are common may no longer be undesirable or difficult to implement. In addition, by eliminating the need to include solutions to prolong ride-through (such as by increasing the helium supply or using a large battery) the complexity and cost of the system, as a whole, may be decreased, and a smaller capacity uninterruptable power supply may be utilized.

In contrast to existing systems and methods which perform quench protection by discharging energy from the magnet once quench begins, the system and method of the present invention provides for quench prevention, whereby potential quench is automatically anticipated before it occurs and the magnet is automatically discharged to prevent quench. In this manner, the prevent invention provides a fully autonomous system that provides for and controls the preventative discharge of the magnet based upon magnet condition indicative of a potential upcoming quench.

Figure 4:
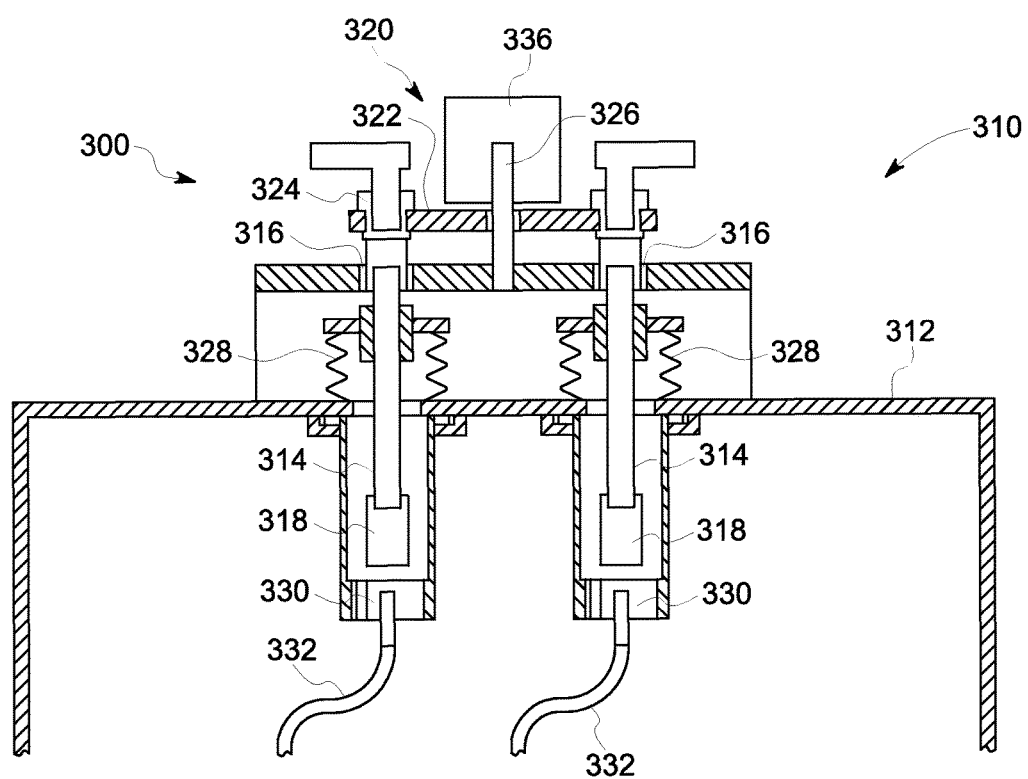
FIG. 4 is a detail, cross-sectional view of a retractable lead assembly for a superconducting magnet system, in accordance with an embodiment of the present invention.
Figure 5:
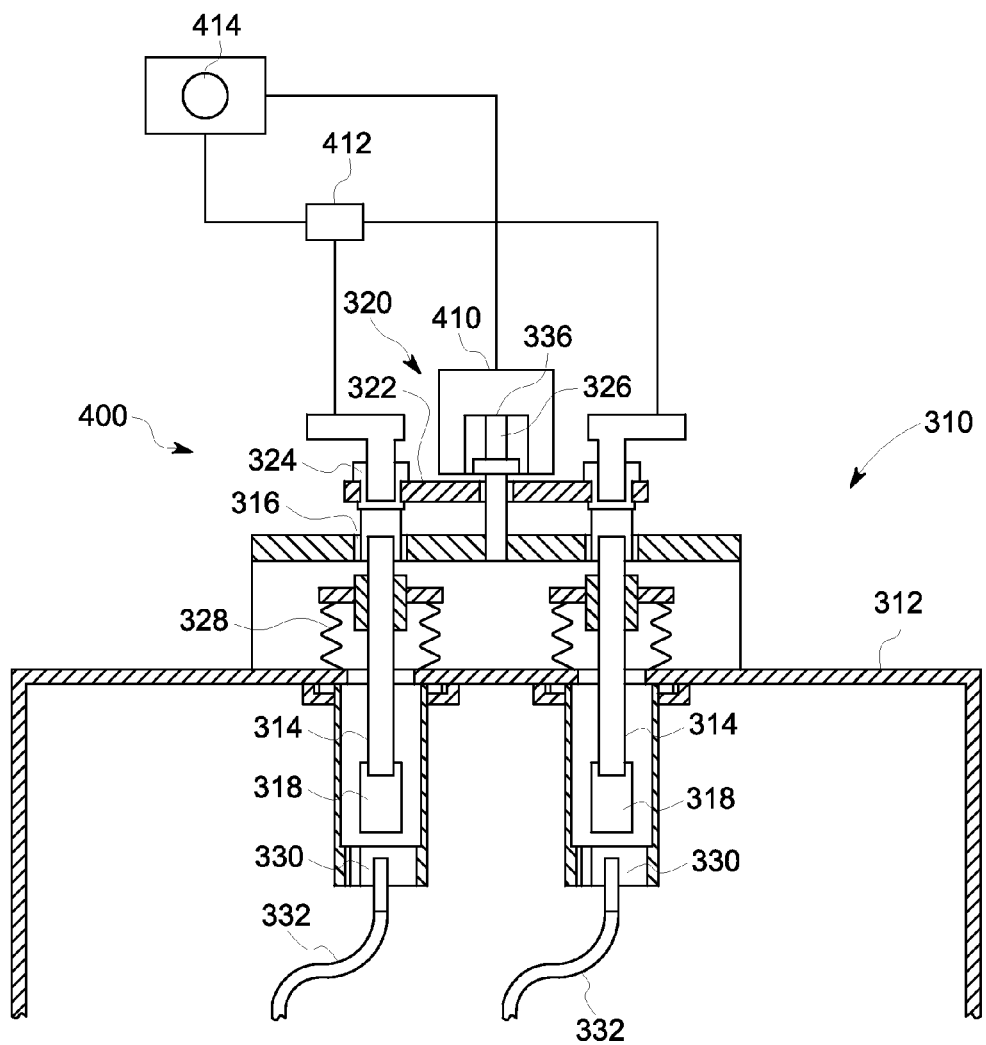
FIG. 5 is a detail, cross-sectional view of a retractable lead assembly for a superconducting magnet system, in accordance with another embodiment of the present invention.

As discussed above in connection with FIGS. 2 and 3, various embodiments of the present invention may utilize retractable leads to provide a selective electrical connection between the magnet coil windings and one or more of a power supply, shimming power supply and discharge module. FIGS. 3-5 illustrate various implementations of a retractable or reclosable lead assembly for use with a superconducting magnet.

With particular reference to FIG. 4, a detail view of a retractable lead assembly 300 for a superconducting magnet system 310 in accordance with an embodiment of the present invention is illustrated. In an embodiment, the superconducting magnet system 310 may include a vacuum chamber 312 housing a superconducting magnet having a plurality of magnet coils, a thermal shield cooled by a cryocooler in a manner heretofore known in the art, and a current lead assembly such as retractable lead assembly 300. As illustrated therein, the retractable lead assembly 300 includes retractable current leads 314 that extend into the vacuum chamber 312 via through-holes 316 in the vacuum chamber 312. The retractable current leads 314 may be secured to a cap by a fastener. The retractable current leads 314 each include a retractable contact 318. An actuator assembly 320 is provided to retractably engage and disengage the retractable contacts 318. The retractable current leads 314 and retractable contacts 318 can be formed as one part (as shown) or separated into multiple parts such as an actuation rod and a contact portion. In the embodiment shown in FIG. 4, the actuator assembly 320 includes a support plate 322 coupled to the fastener 324 and a shaft 326. The shaft 326 enables the retractable current leads 314 to engage and disengage the retractable contact 318. A vacuum seal is made between the retractable current lead 314 and bellows 328.

The current lead assembly 300 also includes current contacts 330 arranged within the vacuum chamber 312. The current contacts 330 are coupled to magnet leads (not shown) via a thermal connector 332. As illustrated in FIG. 4, the actuator assembly 320 may include a pneumatic or electric drive motor 334 coupled to the shaft 326. The motor 336 is configured to rotate the shaft 326 in response to a command from a control unit to advance the retractable leads 314 from a first position in which the contacts 318 of the retractable leads 314 are spaced from the current contacts 330, to a second position in which the contacts 318 of the retractable leads 314 establish an electrical connection with the current contacts 330. The motor 334 is likewise operable to effect disengagement of the contacts 318, 330 by retracting the leads 314 pursuant to a command from a control unit. In an embodiment, the motor 336 is configured to retract and engage the contacts by exerting an axial force on shaft 326 (i.e., by moving the shaft 326 up or down, towards or away from the current contacts 330). In an embodiment, the degree of engagement between the contacts 318, 330 may be determined by contact resistance through measurement in a power lead circuit of the magnet system 310.

With reference to FIG. 5, a retractable lead assembly 400 for a superconducting magnet system 310 according to another embodiment of the present invention is illustrated. The retractable lead assembly 400 is substantially similar to the retractable lead assembly 300 of FIG. 4, where like reference numerals designate like parts. As shown therein, the retractable lead assembly 400 of FIG. 5 includes a motor shield 410 surrounding the motor 336 which ensures that the motor 336 functions properly. The assembly 400 further includes a connection 412 to a power lead circuit electrically coupled to the leads 314 (positive and negative) which is operable to detect the engagement between the contacts 318, 330 in the manner described above. In addition, the assembly includes a pushbutton 414 electrically connected to the motor 336 and the connection 412. In operation, the pushbutton 414 is depressible to retract or extend the leads 314 for engagement/disengagement with current contacts 330 in the manner hereinbefore described. The power lead circuit, via the connection 412, is configured to control the power supplied to meet contact resistance requirements. In an embodiment, an electric solenoid may be utilized in place of the motor 336 to drive the support plate 322 up or down to engage or disengage the leads.

Figure 6:
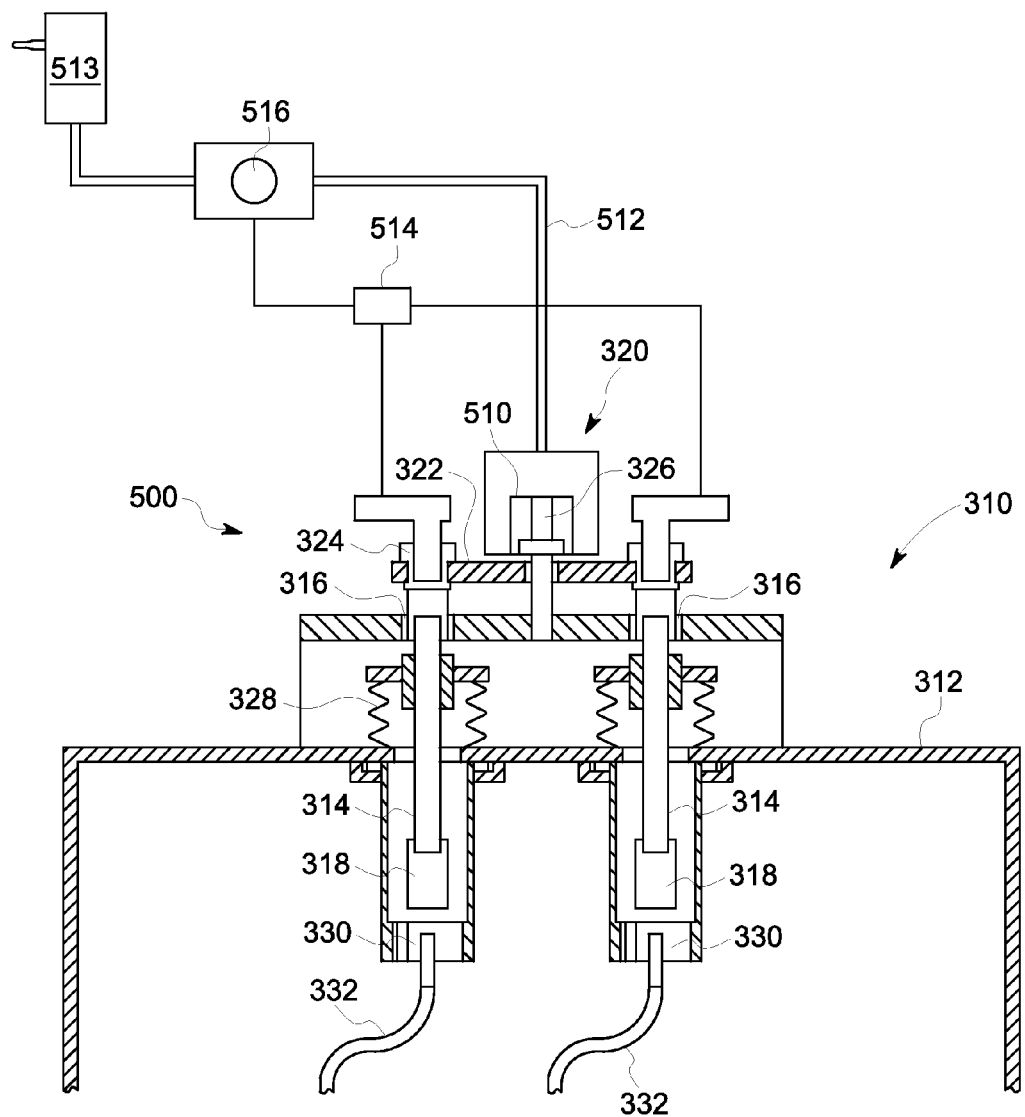
FIG. 6 is a detail, cross-sectional view of a retractable lead assembly for a superconducting magnet system, in accordance with yet another embodiment of the present invention.

With reference to FIG. 6, a retractable lead assembly 500 for a superconducting magnet system 310 according to another embodiment of the present invention is illustrated. The retractable lead assembly 500 is substantially similar to the retractable lead assembly 300 of FIG. 4, where like reference numerals designate like parts. As illustrated in FIG. 6, however, the actuator assembly 320 may included a pneumatic or hydraulic, linear or rotating motor 510 with a pressure line 512 and pressure regulator 513 operable to drive the leads 314 up or down to engage or disengage the leads 314 from the current contacts 330. Like the embodiment of FIG. 5, the assembly 500 may also include a connection 514 to a power lead circuit electrically coupled to the leads 314 (positive and negative) which is operable to detect the engagement between the contacts 318, 330 in the manner described above. In addition, the assembly includes a pushbutton 516 electrically connected to the motor 336 and the connection 514. In operation, the pushbutton 414 is depressible to retract or extend the leads 314 for engagement/disengagement with current contacts 330 in the manner hereinbefore described. The power lead circuit, via the connection 514, is configured to control the power supplied to meet contact resistance requirements.

As will be readily appreciated, embodiments described above relate to a retractable lead assembly for a superconducting magnet system that utilizes one of an electric motor, solenoid, pneumatic linear or rotating motor, and a hydraulic linear or rotating motor to move the retractable leads between a contact position and a retracted position automatically, by the push of a button. In any of these embodiments, it is contemplated that the retractable leads may be actuated from a remote location, such as a service or command center. In an embodiment, the retractable leads may be actuated by command from controller upon at least one of monitored parameters crossing its threshold value.

As discussed above, the retractable lead assemblies of the present invention may be utilized to automatically establish an electrical connection between the magnet and a power supply, such as by the push of a button, to initiate ramping of the magnet. Accordingly, utilizing the present invention, it may no longer be necessary to deploy a field engineer to go through a heretofore fully manual process every time the magnet must be ramped (such as after coldhead changeout, a power outage or quench). Indeed, the retractable lead assemblies contemplated by the various embodiments of the present invention allow for ramping of the magnet from a remote service center, yielding great flexibility, cost savings and the like. It is further contemplated that any of the retractable lead assemblies described in connection with FIGS. 4-6 may be substituted for the lead assemblies in the systems illustrated in FIGS. 1-3 to provide for further automation and remote control of the superconducting magnet system.

In an embodiment, a control system for a superconducting magnet is provided. The control system includes an electrically conductive lead having a first end electrically coupled to the superconducting magnet, at least one of a main power supply, a shimming power supply and a discharge module electrically coupled to a second end of the lead, and a controller in communication with the at least one of the main power supply, the shimming power supply and the discharge module. The controller is configured to monitor at least one magnet parameter value indicative of a state of the superconducting magnet and to automatically control operation of the at least one of the main power supply, the shimming power supply and the discharge module when the magnet parameter value crosses a predetermined threshold value prior to a quench. The control system may also include at least one sensor configured to monitor the at least one magnet parameter value and to communicate the at least one magnet parameter value to the controller. The at least one sensor may be associated with at least one of a coil of the superconducting magnet, a coil support component (former), and a coldhead of the superconducting magnet and is configured to measure a pressure or temperature associated with the magnet, support component or coldhead. In an embodiment, the controller is further configured to receive at least one external parameter indicating a status of a supply of power to the superconducting magnet and to control operation of the at least one of the main power supply, the shimming power supply and the discharge module in dependence upon the external parameter. In an embodiment, the system may also include a switch associated with a persistent mode of the superconducting magnet, wherein the controller may be configured to control operation of the switch to place the magnet in the persistent mode or transition the magnet out of the persistent mode in dependence upon the magnet parameter value. In an embodiment, the controller is configured to issue a command to at least one of the switch, the main power supply, the shimming power supply, and the discharge module in dependence upon a pre-set time condition stored in memory. In an embodiment the discharge module includes at least one of the resistor and diode stack. The discharge module may be configured to selectively provide a controlled ramp-down of the superconducting magnet upon command from the controller. In an embodiment, the controller is configured to automatically initiate re-ramping and re-shimming of the superconducting magnet subsequent to ramp-down. In an embodiment, the electrically conductive lead is a retractable lead configured to selectively contact a current contact of the superconducting magnet. In an embodiment, the controller is configured to move the retractable lead between a first position in which the retractable lead is spaced from the current contact, and a second position in which the retractable lead is in contact with the current contact. In an embodiment, the control system may include an actuator assembly coupled to the retractable lead and in communication with the controller. The controller may be configured to control operation of the actuator assembly to automatically control the retractable lead between the first position and the second position to minimize heat leak through the lead to the magnet. In an embodiment, the actuator assembly includes at least one of an electric motor, a solenoid, a pneumatic drive unit and a hydraulic drive unit.

In an embodiment, a method for controlling operation of a superconducting magnet is provided. The method includes the steps of sensing at least one magnet parameter value indicative of a state of a superconducting magnet, comparing the at least one parameter value to a threshold value stored in memory, and automatically initiating at least one of a ramp-down of the magnet, a ramp-up of the magnet and a shimming operation if the at least one magnet parameter value crosses the threshold value. In an embodiment, the method may also include the step of, prior to initiating ramp-down, ramp-up or shimming, automatically controlling a persistent switch of the magnet to an open state. In an embodiment, the state of the superconducting magnet indicated by the at least one magnet parameter value is a approaching a potential magnet quench event. In an embodiment, the at least one magnet parameter value includes at least one of a pressure or temperature associated with the magnet, a support shell of the magnet and a coldhead configured to provide cooling for the magnet. In an embodiment, the step of automatically initiating at least one of ramp-down of the magnet, ramp-up of the magnet and shimming includes, at a controller, issuing a command to at least one of the switch, a main power supply, a shimming power supply, and a discharge module in dependence upon a pre-set time condition stored in memory. In an embodiment, the discharge module is configured to provide a controlled ramp-down of the superconducting magnet. In an embodiment, the method may also include the step of, prior to initiating ramp-down, ramp-up or shimming, moving a retractable lead assembly having a first end electrically connected to at least one of a main power supply, a shimming power supply, and a discharge module into contact with a current contact of the superconducting magnet under control of a controller.

In another embodiment, a method for automatically controlling a ramp-down of a superconducting magnet comprising is provided. The method includes the steps of electrically coupling a discharge module to the superconducting magnet, the discharge module including at least one resistor and at least one diode stack, monitoring at least one magnet parameter value indicative of a current state of the superconducting magnet, and, at a control unit, automatically initiating a controlled ramp-down of the magnet when the at least one magnet parameter value crosses a threshold value stored in memory. In an embodiment, the step of electrically coupling the discharge module to the superconducting magnet may include moving a retractable lead assembly having a first end electrically connected to the discharge module into contact with a current contact of the superconducting magnet and, prior to initiating the controlled ramp-down, commanding a persistent switch of the magnet to an open state.

In yet another embodiment, a current lead assembly for a superconducting magnet is provided. The current lead assembly includes a vacuum chamber, a superconducting magnet arranged inside of the vacuum chamber and having a magnet lead and a current contact coupled to the magnet lead, a retractable current lead having a retractable contact, and an actuator assembly coupled to the retractable current lead. The actuator assembly is configured to automatically move the retractable contact of the retractable current lead between a first position in which the retractable contact is spaced from the current contact, and a second position in which the retractable contact is in contact with the current contact. In an embodiment, the actuator assembly includes an electric motor. In an embodiment, the actuator assembly includes a solenoid. In an embodiment, the actuator assembly includes a pneumatic drive. In an embodiment, the actuator assembly includes a hydraulic drive.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope.

While the dimensions and types of materials described herein are intended to define the parameters of the invention, they are by no means limiting and are exemplary embodiments. Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, terms such as "first," "second," "third," "upper," "lower," "bottom," "top," etc. are used merely as labels, and are not intended to impose numerical or positional requirements on their objects. Further, the limitations of the following claims are not written in means-plus-function format and are not intended to be interpreted based on 35 U.S.C. §122, sixth paragraph, unless and until such claim limitations expressly use the phrase "means for" followed by a statement of function void of further structure.

This written description uses examples to disclose several embodiments of the invention, including the best mode, and also to enable one of ordinary skill in the art to practice the embodiments of invention, including making and using any devices or systems and performing any incorporated methods. The patentable scope of the invention is defined by the claims, and may include other examples that occur to one of ordinary skill in the art. Such other examples are intended to be within the scope of the claims if they have structural elements that do not differ from the literal language of the claims, or if they include equivalent structural elements with insubstantial differences from the literal languages of the claims.

As used herein, an element or step recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property.

Since certain changes may be made in the above-described invention, without departing from the spirit and scope of the invention herein involved, it is intended that all of the subject matter of the above description or shown in the accompanying drawings shall be interpreted merely as examples illustrating the inventive concept herein and shall not be construed as limiting the invention.

What is claimed is:

1. A control system for a superconducting magnet, comprising:
   a retractable electrically conductive lead that selectively moves between a first position in which the lead is spaced from a current contact of the superconducting magnet and a second position in which the lead contacts the current contact so as to couple the magnet to at least one of a main power supply, a shimming power supply and a discharge module; and
   a controller in communication with the at least one of the main power supply, the shimming power supply and the discharge module;
   wherein the controller is configured to:
      monitor at least one magnet parameter value indicative of a state of the superconducting magnet, and
      automatically control operation of at least one of the main power supply, the shimming power supply, and the discharge module via the retractable electrically conductive lead when the magnet parameter value crosses a predetermined threshold value prior to a quench.

2. The control system of claim 1, further comprising:
   at least one sensor configured to monitor the at least one magnet parameter value and to communicate the at least one magnet parameter value to the controller.

3. The control system of claim 2, wherein:
   the at least one sensor is associated with at least one of a coil of the superconducting magnet, a coil support, and a coldhead of the superconducting magnet and is configured to measure a pressure or temperature associated with the magnet, support former or coldhead.

4. The control system of claim 1, wherein:
   the controller is further configured to receive at least one external parameter indicating a status of a supply of power to the superconducting magnet and to control operation of the at least one of the main power supply, the shimming power supply and the discharge module in dependence upon the external parameter.

5. The control system of claim 1, further comprising:
   a switch associated with a persistent mode of the superconducting magnet;
   wherein the controller is configured to control operation of the switch to place the magnet in the persistent mode or transition the magnet out of the persistent mode in dependence upon the magnet parameter value.

6. The control system of claim 5, wherein:
   the controller is configured to issue a command to at least one of the switch, the main power supply, the shimming power supply, and the discharge module in dependence upon a pre-set time condition stored in memory.

7. The control system of claim 1, wherein:
   the discharge module includes at least one of the resistor and/ or diode stack, the discharge module being configured to selectively provide a controlled ramp-down of the superconducting magnet upon command from the controller.

8. The control system of claim 7, wherein:
the controller is configured to automatically initiate re-ramping and re-shimming of the superconducting magnet subsequent to ramp-down.

9. The control system of claim 1, further comprising:
an actuator assembly coupled to the retractable lead and in communication with the controller;
wherein the controller is configured to control operation of the actuator assembly to automatically control the retractable lead between the first position and the second position to minimize heat leak through the lead to the magnet.

10. The control system of claim 9, wherein:
the actuator assembly includes at least one of an electric motor, a solenoid, a pneumatic drive unit and a hydraulic drive unit.

11. A method for controlling operation of a superconducting magnet, comprising the steps of:
sensing at least one magnet parameter value indicative of a state of a superconducting magnet;
comparing the at least one parameter value to a threshold value stored in memory; and
automatically initiating at least one of a ramp-down of the magnet, a ramp-up of the magnet and a shimming operation via a retractable electrically conductive lead if the at least one magnet parameter value crosses the threshold value.

12. The method according to claim 11, further comprising the step of:
prior to initiating ramp-down, ramp-up or shimming, automatically controlling a persistent switch of the magnet to an open state.

13. The method according to claim 12, wherein:
the state of the superconducting magnet indicated by the at least one magnet parameter value is a proximity to potential onset of a magnet quench event with certain margin.

14. The method according to claim 12, wherein:
the at least one magnet parameter value includes at least one of a pressure or temperature associated with the magnet, a support former of the magnet and a coldhead configured to provide cooling for the magnet.

15. The method according to claim 12, wherein:
the step of automatically initiating at least one of ramp-down of the magnet, ramp-up of the magnet and shimming includes, at a controller, issuing a command to at least one of the switch, a main power supply, a shimming power supply, and a discharge module in dependence upon a pre-set time condition stored in memory.

16. The method according to claim 15, wherein:
the discharge module is configured to provide a controlled ramp-down of the superconducting magnet.

17. The method according to claim 12, further comprising the step of:
prior to initiating ramp-down, ramp-up or shimming, moving a retractable lead assembly having a first end electrically connected to at least one of a main power supply, a shimming power supply, and a discharge module into contact with a current contact of the superconducting magnet under control of a controller.

18. A method for automatically controlling a ramp-down of a superconducting magnet comprising:
electrically coupling a discharge module to the superconducting magnet, the discharge module including at least one of the resistor and diode stack;
monitoring at least one magnet parameter value indicative of a current state of the superconducting magnet;
at a control unit, automatically initiating a controlled ramp-down of the magnet when the at least one magnet parameter value crosses a threshold value stored in memory; and
wherein:
electrically coupling the discharge module to the superconducting magnet includes moving a retractable lead assembly having a first end electrically connected to the discharge module into contact with a current contact of the superconducting magnet; and
prior to initiating the controlled ramp-down, commanding a persistent switch of the magnet to an open state.

19. A current lead assembly for a superconducting magnet, comprising:
a vacuum chamber;
a superconducting magnet arranged inside of the vacuum chamber and having a magnet lead and a current contact coupled to the magnet lead;
a retractable current lead having a retractable contact; and
an actuator assembly coupled to the retractable current lead, the actuator assembly being configured to automatically move the retractable contact of the retractable current lead between a first position in which the retractable contact is spaced from the current contact, and a second position in which the retractable contact is in contact with the current contact.

20. The current lead assembly of claim 19, wherein:
the actuator assembly includes an electric motor.

21. The current lead assembly of claim 19, wherein:
the actuator assembly includes a solenoid.

22. The current lead assembly of claim 19, wherein:
the actuator assembly includes a pneumatic drive.

23. The current lead assembly of claim 19, wherein:
the actuator assembly includes a hydraulic drive.

24. A control system for a superconducting magnet, comprising:
an electrically conductive lead having a first end electrically coupled to the superconducting magnet;
at least one of a main power supply, a shimming power supply and a discharge module electrically coupled to a second end of the lead;
a controller in communication with the at least one of the main power supply, the shimming power supply and the discharge module;
a switch associated with a persistent mode of the superconducting magnet; and
wherein the controller is configured to:
monitor at least one magnet parameter value indicative of a state of the superconducting magnet and to automatically control operation of the at least one of the main power supply, the shimming power supply and the discharge module when the magnet parameter value crosses a predetermined threshold value prior to a quench;
control operation of the switch to place the magnet in the persistent mode or transition the magnet out of the persistent mode in dependence upon the magnet parameter value; and
issue a command to at least one of the switch, the main power supply, the shimming power supply, and the discharge module in dependence upon a pre-set time condition stored in memory.

* * * * *